US008592319B2

(12) United States Patent
Wada et al.

(10) Patent No.: US 8,592,319 B2
(45) Date of Patent: Nov. 26, 2013

(54) SUBSTRATE PROCESSING METHOD AND SUBSTRATE PROCESSING APPARATUS

(75) Inventors: Nobuhiro Wada, Nirasaki (JP); Makoto Kobayashi, Hsinchu (TW); Hiroshi Tsujimoto, Nirasaki (JP); Jun Tamura, Nirasaki (JP); Mamoru Naoi, Nirasaki (JP); Jun Oyabu, Nirasaki (JP)

(73) Assignee: Tokyo Electron Limited (JP)

( * ) Notice: Subject to any disclaimer, the term of this patent is extended or adjusted under 35 U.S.C. 154(b) by 104 days.

(21) Appl. No.: 13/167,574

(22) Filed: Jun. 23, 2011

(65) Prior Publication Data
US 2011/0318934 A1 Dec. 29, 2011

Related U.S. Application Data

(60) Provisional application No. 61/362,465, filed on Jul. 8, 2010.

(30) Foreign Application Priority Data

Jun. 24, 2010 (JP) ................................. 2010-144164

(51) Int. Cl.
*H01L 21/3065* (2006.01)
(52) U.S. Cl.
USPC ................................ 438/714; 216/61; 216/71

(58) Field of Classification Search
USPC ........................................ 438/714; 216/71, 61
See application file for complete search history.

(56) References Cited

U.S. PATENT DOCUMENTS 6,511,917 B2 * 1/2003 Haji et al. ...................... 438/706
7,784,426 B2 * 8/2010 Schmitt ...................... 118/723 E

FOREIGN PATENT DOCUMENTS

JP 2007-505450 3/2007

* cited by examiner

*Primary Examiner* — Roberts Culbert
(74) *Attorney, Agent, or Firm* — Cantor Colburn LLP

(57) ABSTRACT

A substrate processing apparatus includes a chamber accommodating a wafer, a susceptor disposed inside the chamber and on which the wafer is held, an upper electrode facing the susceptor, and a second high frequency power source connected to the susceptor, wherein the upper electrode is electrically connected to a ground and is moveable with respect to the susceptor. The substrate processing apparatus divides a potential difference between plasma generated in a processing space and the ground into a potential difference between the plasma and a dielectric and a potential difference between the dielectric and the ground by burying the dielectric in the upper electrode, and changes a gap between the upper electrode and the susceptor. Accordingly, plasma density between the upper electrode and the susceptor is changed.

7 Claims, 6 Drawing Sheets

SUBSTRATE PROCESSING METHOD AND SUBSTRATE PROCESSING APPARATUS

CROSS-REFERENCE TO RELATED PATENT APPLICATIONS

This application claims the benefit of Japanese Patent Application No. 2010-144164, filed on Jun. 24, 2010, in the Japan Patent Office, and U.S. patent application Ser. No. 61/362,465, filed on Jul. 8, 2010, the disclosures of which are incorporated herein in their entireties by reference.

BACKGROUND OF THE INVENTION

1. Field of the Invention

The present invention relates to a substrate processing method and a substrate processing apparatus, which perform a plurality of plasma processes on a substrate by changing process conditions in one processing chamber.

2. Description of the Related Art

While performing a wiring process or the like on a substrate such as a semiconductor wafer, a minute process needs to be performed on the substrate, and thus a substrate processing method using plasma is widely used.

Recently, accompanied by a size-increase of a substrate, many studies have been conducted to promote uniformity of an etching rate on a substrate surface regarding a substrate processing method using a reaction ion etching processing method, and a method of compensating for non-uniformity of voltage in an electrode plane by burying a dielectric in an upper electrode with respect to a structure inside a chamber of a substrate processing apparatus including the upper electrode and a lower electrode has been suggested (for example, refer to Patent Document 1).

Meanwhile, in order to manufacture a substrate, for example a semiconductor wafer (hereinafter, simply referred to as a wafer), a plurality of plasma processes are required to be performed on one wafer. Thus, recently, so-called one-chamber plural processes, where a plurality of plasma processes are performed in one processing chamber by sequentially changing process conditions, became demanded.

Accordingly, in order to realize such a demand, a substrate processing apparatus, a structure inside a chamber of which includes an upper electrode and an lower electrode, which generates a plurality of process conditions by changing electric field intensity between the upper electrode and the lower electrode by allowing one of the upper electrode and the lower electrode to be moveable with respect to the other and changing a gap which is an interval between the upper electrode and the lower electrode, has been suggested.

[Patent Document 1] Japanese Unexamined Patent Application Publication No. 2007-505450

SUMMARY OF THE INVENTION

However, in the substrate processing apparatus, where one of the upper electrode and the lower electrode is moveable with respect to the other, the process conditions may be changed without having to open the chamber, but plasma is diffused in a peripheral portion of a processing space between the upper electrode and the lower electrode. Thus, it is difficult to realize uniform density distribution of plasma in the processing space, and as a result, it is difficult to realize the one-chamber plural processes while performing a plasma process uniformly on the substrate.

To solve the above and/or other problems, the present invention provides a substrate processing method and a substrate processing apparatus, where one-chamber plural processes is realizable while performing a plasma process uniformly on a substrate.

According to an aspect of the present invention, there is provided a substrate processing method for performing an etching process on a substrate by using plasma, wherein an etching rate on the substrate is changed in a substrate processing apparatus including an accommodating chamber which accommodates the substrate, a lower electrode which is disposed inside the accommodating chamber and on which the substrate is held, an upper electrode which faces the lower electrode, a high frequency power source which is connected to the lower electrode, a processing space between the upper electrode and the lower electrode, and a ground which is electrically connected to the upper electrode, one of the upper electrode and the lower electrode being moveable with respect to the other, the substrate processing method including: dividing a potential difference between plasma generated in the processing space and the ground into a potential difference between the plasma and a dielectric and a potential difference between the dielectric and the ground, by burying the dielectric in at least a portion of the upper electrode; and changing an interval between the upper electrode and the lower electrode.

The upper electrode may be an electrode having a plate shape, and the dielectric may be provided along a plane direction of the upper electrode.

The dielectric may be provided only in a portion, of the upper electrode, facing a central portion of the substrate held on the lower electrode.

The dielectric may have a circular plate shape having a through hole in a central portion of the dielectric, and may be buried in the upper electrode such that the through hole faces a central portion of the substrate held on the lower electrode.

The interval between the upper electrode and the lower electrode may be decreased, thereby increasing the etching rate.

The dielectric may be formed of any one of quartz, yttria ($Y_2O_3$), alumina ($Al_2O_3$), silica ($SiO_2$), aluminum nitride (AlN), boron nitride (BN), and silicon carbide (SiC).

According to another aspect of the present invention, there is provided a substrate processing apparatus applied to the above substrate processing method, the substrate processing apparatus including: an accommodating chamber which accommodates the substrate; a lower electrode which is disposed inside the accommodating chamber and on which the substrate is held; an upper electrode which faces the lower electrode; a high frequency power source which is connected to the lower electrode; a processing space between the upper electrode and the lower electrode: and a ground which is electrically connected to the upper electrode, wherein one of the upper electrode and the lower electrode is moveable with respect to the other and a dielectric is buried in at least a portion of the upper electrode.

The upper electrode may be an electrode having a plate shape, and the dielectric may be provided along a plane direction of the upper electrode.

BRIEF DESCRIPTION OF THE DRAWINGS

The above and other features and advantages of the present invention will become more apparent by describing in detail exemplary embodiments thereof with reference to the attached drawings in which:

FIG. 4(A) is Comparative Example 1, FIG. 4(B) is Embodiment 1, and FIG. 4(C) is Embodiment 2;

EXPLANATION ON REFERENCE NUMERALS

Figure 1:
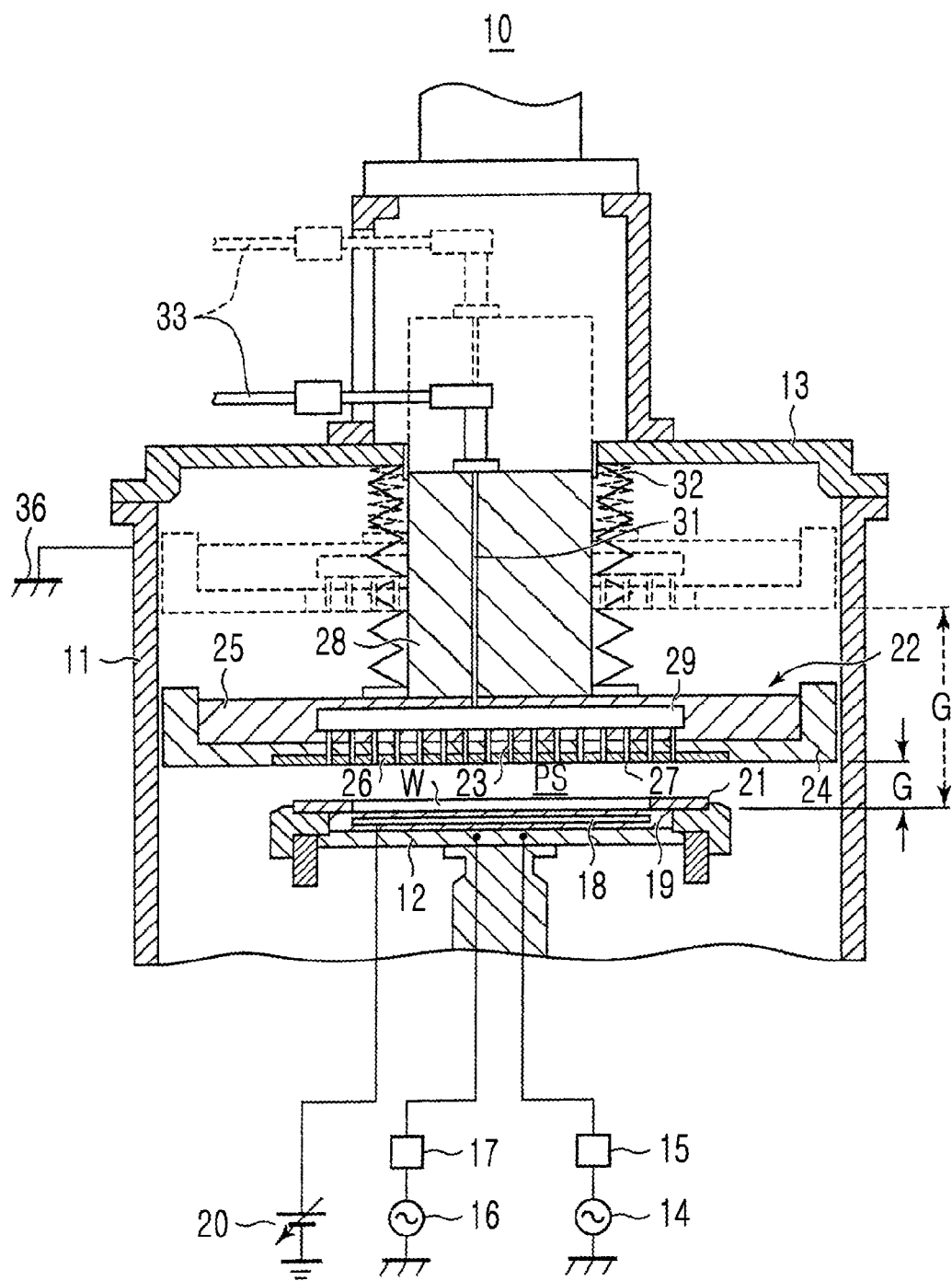
FIG. 1 is a cross-sectional view of a schematic configuration of a substrate processing apparatus, according to an embodiment of the present invention.

10: substrate processing apparatus
11: processing chamber
12: susceptor (lower electrode)
22: shower head
23, 27: gas hole
24: upper electrode
26: dielectric
32: bellows
W: wafer
G: gap

DETAILED DESCRIPTION OF THE INVENTION

Hereinafter, the present invention will be described in detail by explaining exemplary embodiments of the invention with reference to the attached drawings.

FIG. 1 is a cross-sectional view of a schematic configuration of a substrate processing apparatus, according to an embodiment of the present invention. The substrate processing apparatus performs a predetermined plasma etching process on a wafer W.

In FIG. 1, a substrate processing apparatus 10 includes a cylindrical chamber 11 (processing chamber) accommodating a wafer W having a diameter of, for example, 300 mm, where a susceptor 12 (lower electrode) having a circular plate shape and on which the wafer W is held is disposed in a lower portion of the inside of the chamber 11 in FIG. 1, and a upper end of the chamber 11 in FIG. 1 is covered by a cover unit 13 that freely shuts and opens and has a circular plate shape.

The inside of the chamber 11 is depressurized by a TMP (Turbo Molecular Pump), DP (Dry Pump) (both not shown), etc., and a pressure inside the chamber 11 is controlled by an APC valve (not shown).

A first high frequency power source 14 is connected to the susceptor 12 via a first matcher 15 and a second high frequency power source 16 is connected to the susceptor 12 via a second matcher 17. The first high frequency power source 14 applies a bias power of a high frequency power of a relatively low frequency, for example, 13 MHz, to the susceptor 12, and the second high frequency power source 16 applies a plasma generating power of a high frequency power of a relatively high frequency, for example, 40 MHz, to the susceptor 12. Also, the susceptor 12 applies the plasma generating power to a processing space PS inside the chamber 11.

An electrostatic chuck 19 including an electrostatic electrode 18 therein is disposed on an upper portion of the susceptor 12. The electrostatic chuck 19 is formed of a ceramic member having a circular plate shape, and a direct current (DC) supply source 20 is connected to the electrostatic electrode 18. When a positive DC voltage is applied to the electrostatic electrode 18, negative potential is generated on a surface (hereinafter, referred to as the back surface) of the wafer W facing the electrostatic chuck 19 and thus an electric field is generated between the electrostatic electrode 18 and the back surface of the wafer W. Thus, the wafer W is adsorbed to and held on the electrostatic chuck 19 due to Coulomb force or Johnson-Rahbec force resulting from the electric field.

A focus ring 21, which is a ring shaped member, is held on the susceptor 12 so as to surround the adsorbed and held wafer W. The focus ring 21 is formed of an electric conductor, for example, single crystal silicon same as a material for forming the wafer W. Since the focus ring 21 is formed of an electric conductor, a distribution range of plasma is enlarged not only over the wafer W, but also over the focus ring 21 so that density of plasma over a peripheral portion of the wafer W is maintained to be the same as density of plasma over a central portion of the wafer W. Accordingly, uniformity in a plasma etching process performed on an entire surface of the wafer W may be maintained.

A shower head 22 is disposed above the susceptor 12 in FIG. 1 to face the susceptor 12. The shower head 22 includes a conductive upper electrode 24 having a plurality of gas holes 23, a dielectric 26 buried in the upper electrode 24 and formed of, for example, quartz, a cooling plate 25 supporting the upper electrode 24 and the dielectric 26 such that the upper electrode 24 and the dielectric 26 hang down and are detachable from the cooling plate 25, and a shaft 28 as a supporting member for supporting the cooling plate 25 such that the cooling plate 25 hang down. A gas hole 27 communicating with the gas hole 23 of the upper electrode 24 is formed in the dielectric 26. The upper electrode 24 is electrically grounded, and serves as a ground electrode with respect to plasma generating power applied into the chamber 11. Also, an outer diameter of the upper electrode 24 is almost the same as an inner diameter of the chamber 11 and thus the upper electrode 24 is disposed to loosely fit into the chamber 11. Also, the upper electrode 24 is electrically connected to a ground 36 via a bellows 32 that will be described later, the cover unit 13, and a wall portion of the chamber 11.

The shaft 28 penetrates through the cover unit 13, and the upper portion of the shaft 28 is connected to a lift mechanism (not shown) disposed at the upper portion of the substrate processing apparatus 10. The lift mechanism moves the shaft 28 up and down in FIG. 1, and at this time, the shower head 22 including the upper electrode 24 moves up and down in the chamber 11, like a piston. Accordingly, a gap G constituting a thickness of a space between the shower head 22 and the susceptor 12 (hereinafter, simply referred to as the gap G) may be adjusted. A maximum value of a movement amount of the shower head 22 in up and down directions in FIG. 1 is, for example, 70 mm.

The shower head 22 includes a process gas introducing system including a gas passage 31 penetrating through the shaft 28 in up and down directions in FIG. 1, a buffer chamber 29, or gas holes 23 and 27, and a gas supply pipe 33 connected to a gas supply source (not shown) for supplying a process gas from the outside to the process gas introducing system. The bellows 32 having a vacuum blocking function is provided to have a same central point as the shaft 28, in a circumferential portion of the shaft 28 hanging and supporting the shower head 22 which is an electrode moving up and down.

An upper end of bellows 32 having a cylindrical shape in FIG. 1 is combined to a bottom surface of the cover unit 13, and a lower end of the bellows 32 in FIG. 1 is combined to a top surface of the cooling plate 25 of the shower head 22. Accordingly, in a penetrating portion of the shaft 28 penetrating through the cover unit 13, the bellows 32 grows longer or shorter according to displacement of an electrode with respect to the cover unit 13, and an atmosphere in the chamber 11 is sealed from an atmosphere around the shaft 28, and thus a state where the atmosphere in the chamber 11 is isolated from an air is maintained. Also, in FIG. 1, the shower head 22 descended lowest is shown in a solid line, and the shower head 22 ascended highest is shown in a broken line.

In the substrate processing apparatus 10 having such a configuration, a process gas supplied from the gas supply pipe 33 to the buffer chamber 29 is introduced into the chamber 11 through the gas hole 23 of the upper electrode 24 and the gas hole 27 of the dielectric 26. The introduced process gas turns into plasma by being excited by the plasma generating power applied from the second high frequency power source 16 into the chamber 11 through the susceptor 12. Positive ions in the plasma are dragged toward the wafer W due to a bias power applied to the susceptor 12 by the first high frequency power source 14, and perform a plasma etching process on the wafer W.

Operations of the respective elements of the substrate processing substrate 10 are controlled according to a program corresponding to the plasma etching process, by a CPU of a controller (not shown) included in the substrate processing apparatus 10.

However, in a substrate processing apparatus, where one of the upper electrode 24 and the susceptor 12 is moveable with respect to the other but the dielectric 26 is not buried in the upper electrode 24, i.e., in the conventional substrate processing apparatus described above, density of plasma is increased as the plasma is excited by an uniform electric field generated near the susceptor 12 by the plasma generating power applied to the susceptor 12, and density of plasma is increased near the upper electrode 24 as the plasma is excited by an uniform electric field generated by a potential difference between the plasma and the upper electrode 24, and as a result, plasma density in the processing space PS is increased.

However, plasma density is decreased in the peripheral portion of the processing space PS since the plasma is diffused in the peripheral portion of the processing space PS, and as a result, it is difficult to realize uniform density distribution of plasma in the processing space PS. At this time, plasma diffusion may be somewhat suppressed by narrowing the gap G, but non-uniformity of density distribution of plasma cannot be resolved. In other words, in the conventional substrate processing apparatus, it is difficult to realize one-chamber plural processes while performing a plasma process uniformly on a wafer.

Considering such a situation, the present inventors assiduously studied to establish a substrate processing method and a substrate processing apparatus, where, in a substrate processing apparatus that applies plasma generating power and bias power to the susceptor 12, one-chamber plural processes is realized while performing a plasma process uniformly on a wafer. As a result, the present inventors discovered that a plurality of process conditions can be made while realizing uniform density distribution of plasma in the processing space PS by providing the upper electrode 24 to be moveable with respect to the susceptor 12 and burying the dielectric 26 in a surface of the upper electrode 24 facing the susceptor 12, where the upper electrode 24 is electrically grounded, as shown in FIG. 1.

Hereinafter, principles of the substrate processing method of the present invention will be described in detail.

In FIG. 1, the dielectric 26 has electric capacity according to a thickness and relative dielectric constant of the dielectric 26 as shown in Equation 1 below.

$$C = \in \times S/d \tag{1}$$

Here, C denotes electric capacity (capacitance), E denotes a relative dielectric constant, S denotes a surface area of an insulating member (the gap G or the dielectric 26), and d denotes a thickness of the insulating member.

Regarding a portion where the dielectric 26, which serves as a capacitor C, is buried in the upper electrode 24, it can be assumed that the capacitor C is inserted between the processing space PS and the ground 36, and thus, a potential difference between the plasma of the processing space PS and the ground 36 may be divided into a potential difference between the plasma and the upper electrode 24 (dielectric 26) and a potential difference between the dielectric 26, which serves as the capacitor C, and the ground 36. Accordingly, the potential difference between the plasma and the upper electrode 24 may be decreased, thereby decreasing plasma density.

Meanwhile, in a portion where the dielectric 26 is not buried in the upper electrode 24, since the potential difference between the plasma of the processing space PS and the ground 36 is not divided, the potential difference between the plasma and the upper electrode 24 is not decreased, and thus plasma density may be maintained somewhat high.

In other words, by burying the dielectric 26 not in a portion of the upper electrode 24 facing the peripheral portion of the processing space PS in which plasma is diffused, but in a portion of the upper electrode 24 facing the central portion of the processing space PS, plasma density in the peripheral portion of the processing space PS is increased while decreasing plasma density in the central portion of the processing space PS. Accordingly, uniform density distribution of plasma in the processing space PS may be realized.

Also, a plurality of process conditions may be generated while realizing uniform density distribution of plasma by narrowing the gap G and making an area having high plasma density near the susceptor 12 and an area having high plasma density near the upper electrode 24 approach each other to increase plasma density in the processing space PS, or by increasing the gap G and making the area having high plasma density near the susceptor 12 and the area having high plasma density near the upper electrode 24 separated from each other to decrease plasma density in the processing space PS.

In other words, in the present invention, one-chamber plural processes is realized while performing a plasma process uniformly on the wafer W, according to a synergism of decreasing the plasma density above the wafer W (the processing space PS) by burying the dielectric 26 in a portion of the upper electrode 24, and changing the gap G between the upper electrode 24 and the susceptor 12. Also, here, when the gap G is decreased by making the upper electrode 24 and the susceptor 12 approach each other, the area having high plasma density near the susceptor 12 and the area having high plasma density near the upper electrode 24 approach each other, and thus the plasma density in the processing space PS is increased, thereby improving an etching rate (E/R) on the wafer W.

Hereinafter, experiment examples performed to check principles of the substrate processing method of the present invention will be described.

Experiment Example 1

Figure 2:
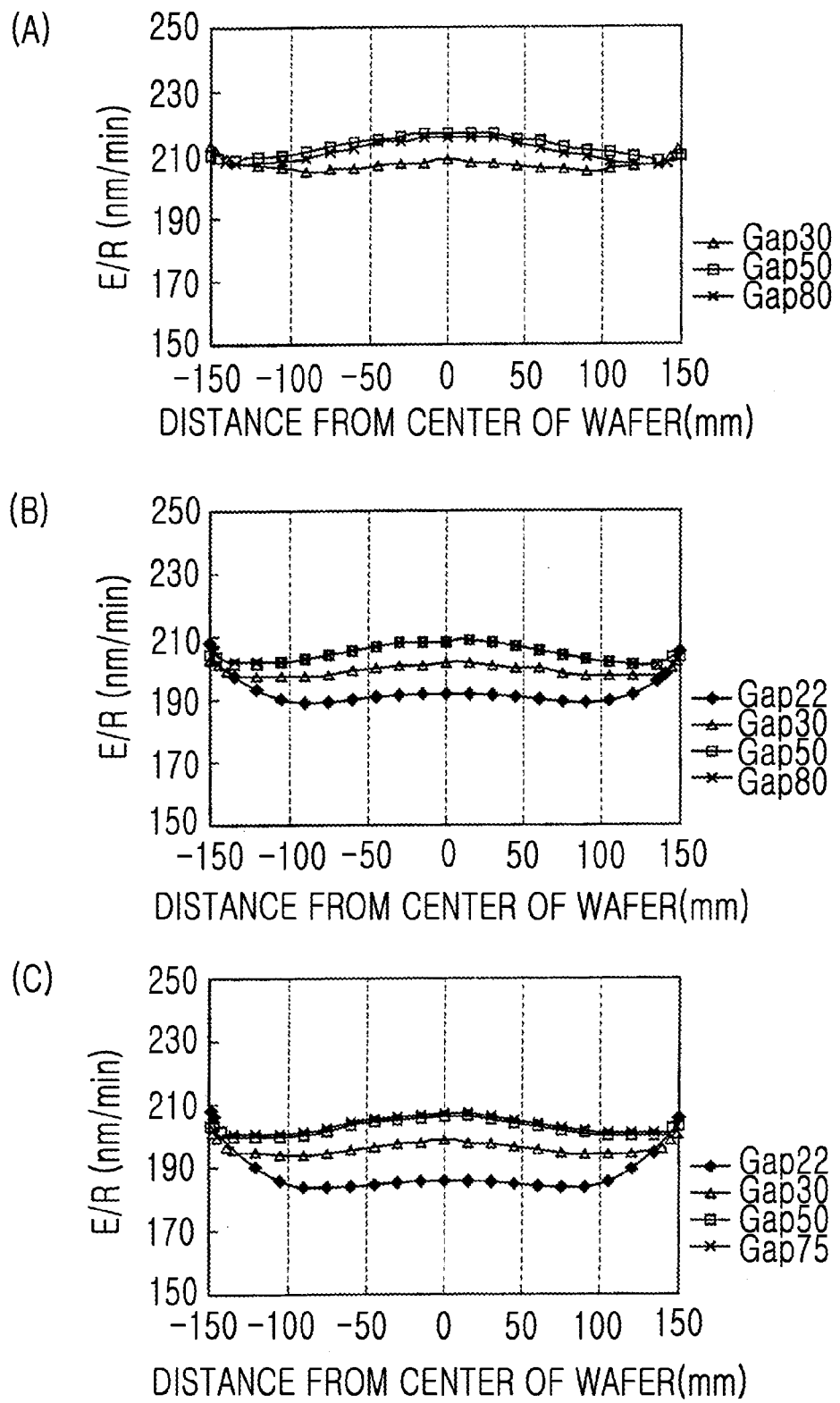
FIG. 2 is a view showing a result of Experiment Example 1 according to the present embodiment.

In the apparatus of FIG. 1, where a quartz plate as the dielectric 26 is buried in the upper electrode 24, results of gap dependency of E/R on the wafer W are shown in FIG. 2, when a plasma etching process is performed on the wafer W held on the susceptor 12, where a thickness of the quartz plate is changed to 3.4 mm, 10 mm, and 15 mm, each pressure in a chamber is set to 60 mTorr (7.98 Pa), a plasma generating power applied to the susceptor 12 is set to 400 W, a bias power is set to 1000 W, a mixture gas of $C_4F_8$:45 sccm, Ar:1000 sccm, and $O_2$:30 sccm is used as a process gas, a temperature of the susceptor 12 is set to 20° C. and a temperature of the upper electrode 24 is set to 60° C. In FIG. 2, a vertical axis denotes E/R and a horizontal axis denotes a distance from a central portion of the wafer W. Also, (A) shows a case when the thickness of the quartz plate is 3.4 mm, (B) shows a case when the thickness of the quartz plate is 10 mm, and (C) shows a case when the thickness of the quartz plate is 15 mm. Also, the gap G was changed in the range from 22 mm to 80 mm. "Gap30", "Gap50", "Gap80", and so on in each graph denote each gap G in a unit of mm when the gap G between the upper electrode 24 and the susceptor 12 is changed.

In the plasma etching process of FIG. 2, E/R in the central portion of the wafer W has almost the same as E/R in the peripheral portion of the wafer W. It can be known that E/R is sensitively changed as changing the gap G, and gap dependency of E/R is increased as the thickness is increased.

Specifically, it is thought that it is due to the following reasons that the gap dependency of E/R is increased as the thickness of the quartz plate is increased.

When the thickness of the quartz plate is thick, capacitance $C_B$ of the dielectric 26 is decreased, and thus the potential difference between the dielectric 26 and the ground 36 is increased, and relatively, the potential difference between the plasma of the processing space PS and the upper electrode 24 (dielectric 26) is decreased. As a result, electric field intensity between the plasma and the upper electrode 24 is decreased, and thus plasma density is decreased. Here, when the gap G is decreased, the area having high plasma density near the susceptor 12 and the area having high plasma density near the upper electrode 24 approach each other, and thus plasma density is increased. In other words, when the thickness of the quartz plate is thick, plasma density is largely changed as changing of the gap G. Accordingly, the gap dependency of E/R is increased.

Meanwhile, when the thickness of the quartz plate is thin, the capacitance $C_B$ of the dielectric 26 is increased, and thus, the potential difference between the dielectric 26 and the ground 36 is decreased, and relatively the potential difference between the plasma of the processing space PS and the upper electrode 24 (dielectric 26) is increased. As a result, the electric field intensity between the plasma and the upper electrode 24 is not decreased, and thus plasma density is not decreased. Here, even when the area having high plasma density near the susceptor 12 and the area having high plasma density near the upper electrode 24 approach each other by narrowing the gap G, the plasma density does not change much because plasma density is already high before the approaching. Accordingly, the gap dependency of E/R is decreased.

Also, in terms of increasing the gap dependency of E/R, i.e., in terms of enlarging a control range of E/R, from the results of Experiment Example 1, the thickness of the quartz plate may be thick, in detail, 10 mm or above, preferably about 15 mm.

Experiment Example 2

Figure 3:
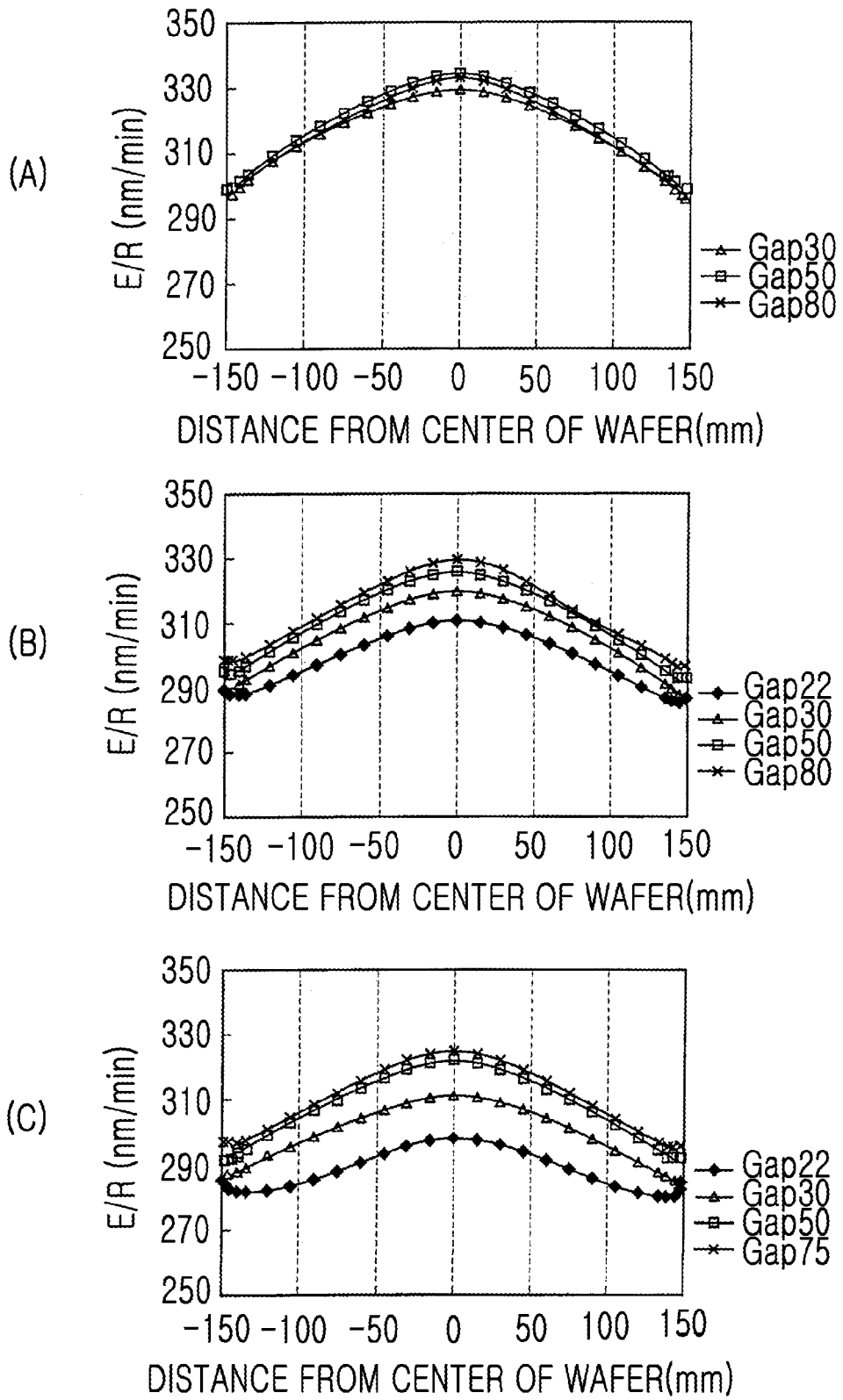
FIG. 3 is a view showing a result of Experiment Example 2 according to the present embodiment.

In the apparatus of FIG. 1, where a quartz plate as the dielectric 26 is buried in the upper electrode 24, results of gap dependency of E/R on the wafer W are shown in FIG. 3, when a plasma etching process is performed on the wafer W held on the susceptor 12, where a thickness of the quartz plate is changed to 3.4 mm, 10 mm, and 15 mm, each pressure in a chamber is set to 80 mTorr (1.06×10 Pa), a plasma generating power applied to the susceptor 12 is set to 500 W, a bias power is set to 1000 W, a mixture gas of $CF_4$:250 sccm and Ar:200 sccm is used as a process gas, a temperature of the susceptor 12 is set to 20° C. and a temperature of the upper electrode 24 is set to 60° C. In FIG. 3, a vertical axis denotes E/R and a horizontal axis denotes a distance from a central portion of the wafer W. Also, (A) shows a case when the thickness of the quartz plate is 3.4 mm, (B) shows a case when the thickness of the quartz plate is 10 mm, and (C) shows a case when the thickness of the quartz plate is 15 mm. Also, the gap G was changed in the range from 22 mm to 80 mm. "Gap30", "Gap50", "Gap80", and so on in each graph denote each gap G in a unit of mm when the gap G between the upper electrode 24 and the susceptor 12 is changed.

In the plasma etching process of FIG. 3, E/R of the central portion of the wafer W is higher than E/R of the peripheral portion. Here, it can be known that E/R is sensitively changed as changing the gap G, and the gap dependency of E/R is increased as the thickness of the quartz plate is increased.

According to the present embodiment, the potential difference between the plasma of the processing space PS and the ground 36 is divided into the potential difference between the plasma and the upper electrode 24 and the potential difference between the dielectric 26, which serves as the capacitor C, and the ground 36 by burying the dielectric 26 in a portion of the upper electrode 24, while changing the gap G by moving the upper electrode 24 with respect to the susceptor 12, thereby changing the plasma density in the processing space PS. Thus, one-chamber plural processes may be realized while performing the plasma process uniformly on the wafer W.

Also, according to the present embodiment, the process conditions may be changed by only changing the gap G without having to open the chamber, and thus high process efficiency may be obtained during a plasma process including a plurality of processes.

In FIGS. 2 and 3, the control range of E/R with respect to a changing range of the gap G may be increased by increasing the thickness of the dielectric 26. However, since the gas holes 27 for supplying the process gas to the processing space PS need to be formed in the dielectric and a plurality of gas holes having generally 0.5 mm φ are formed in the dielectric, the thickness of the dielectric is limited in terms of manufacture. Thus, the thickness of the dielectric 26 is, for example, about 15 mm in maximum.

Experiment Example 3

The following three specifications were prepared for the upper electrode.

Figure 4:
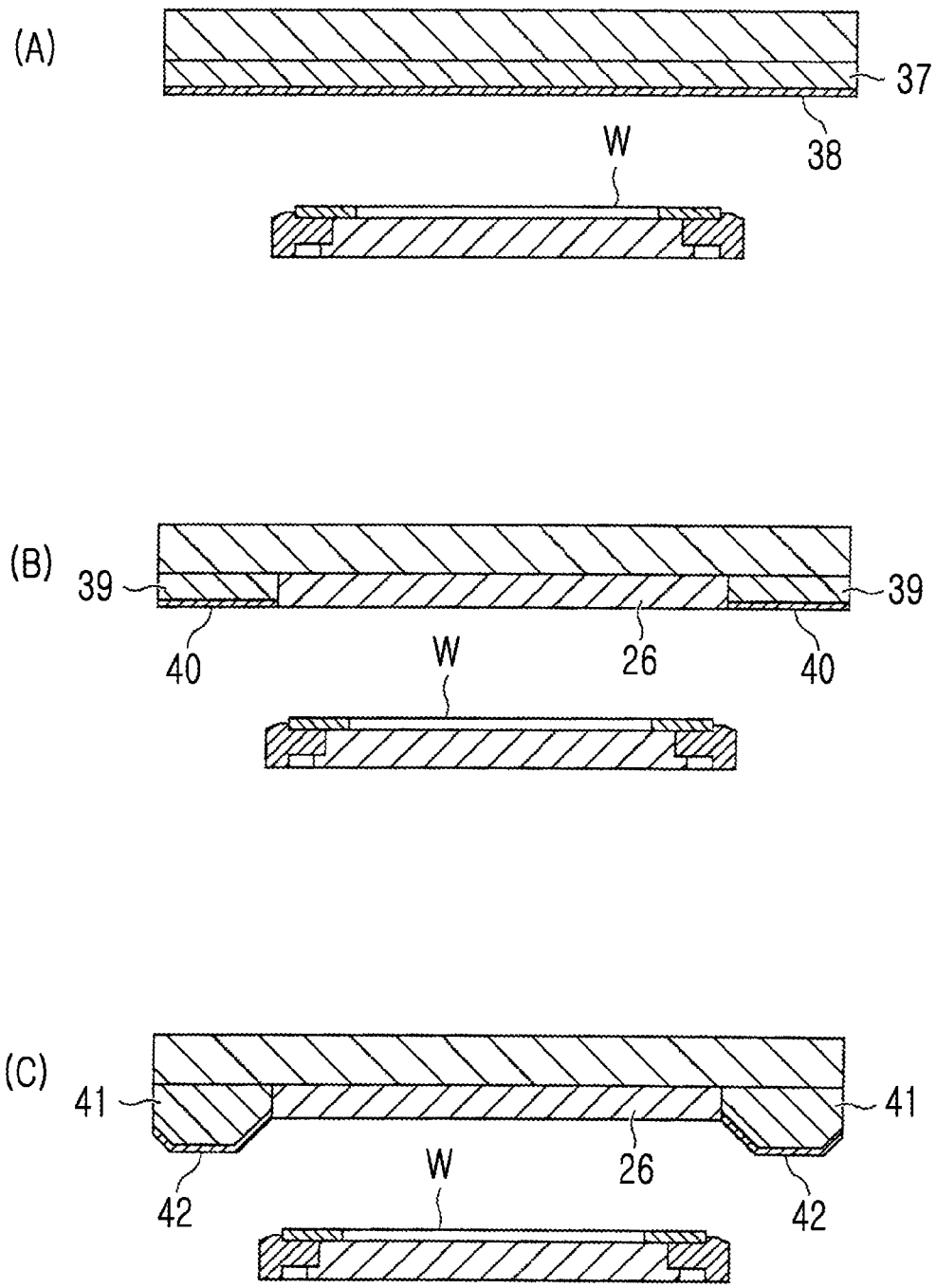
FIG. 4 schematically shows a structure of an upper electrode used in Experiment Example 3, where

First, a specification (Comparative Example 1) in which the dielectric 26 is not buried, the upper electrode is formed of only an aluminum material 37, and a portion facing the processing space PS is covered by a thin film of yttria 38, was prepared (FIG. 4(A)).

Also, a specification (Embodiment 1), where the dielectric 26 having a circular plate shape and φ 360 mm is buried in a central portion, an annular aluminum material 39 surrounds the dielectric 26, and a portion of the aluminum material 39 facing the processing space PS is covered by a thin film of yttria 40, was prepared (FIG. 4(B)). In this specification, the portion of the dielectric 26 facing the processing space PS and the portion of the aluminum material 39 facing the processing space PS were set to have the same height. In other words, in the present specification, the portion of the upper electrode facing the processing space PS was formed to have a flat shape.

Also, a specification (Embodiment 2), where the dielectric 26 having a circular plate shape and φ 360 mm is buried in a central portion, an annular aluminum material 41 surrounds the dielectric 26, and a portion of the aluminum material 41 facing the processing space PS is covered by a thin film of yttria 42, was prepared (FIG. 4(C)). In this specification, a portion of the aluminum material 41 facing the processing space PS protrudes toward the processing space PS than a portion of the dielectric 26 facing the processing space PS. In other words, in the present specification, the peripheral portion of the portion of the upper electrode facing the processing space PS protrudes toward the processing space PS.

By respectively applying Comparative Example 1, Embodiment 1, and Embodiment 2 to the substrate processing apparatus 10, a hole having φ 250 nm is formed in the wafer W by etching a film of silicon oxide of the wafer W by using a plasma etching process, and in-plane E/R uniformity of the wafer W at this time was measured. Conditions of the plasma etching process are as follows: pressure inside the chamber 11 was set to 40 mTorr (5.33 Pa); a plasma generating power applied to the susceptor 12 was set to 2700 W; a bias power was set to 3000 W; a mixture gas of $C_4F_6$:30 sccm, Ar:1100 sccm, and $O_2$:30 sccm was used as a process gas; RDC was set to 50; a temperature of the susceptor 12 was set to 20° C.; a temperature of the upper electrode was set to 60° C.; and a temperature of a side wall of the chamber 11 was set to 60° C. Also, the gap G was set to each of 22 mm, 25 mm, 30 mm, and 35 mm.

Figure 5:
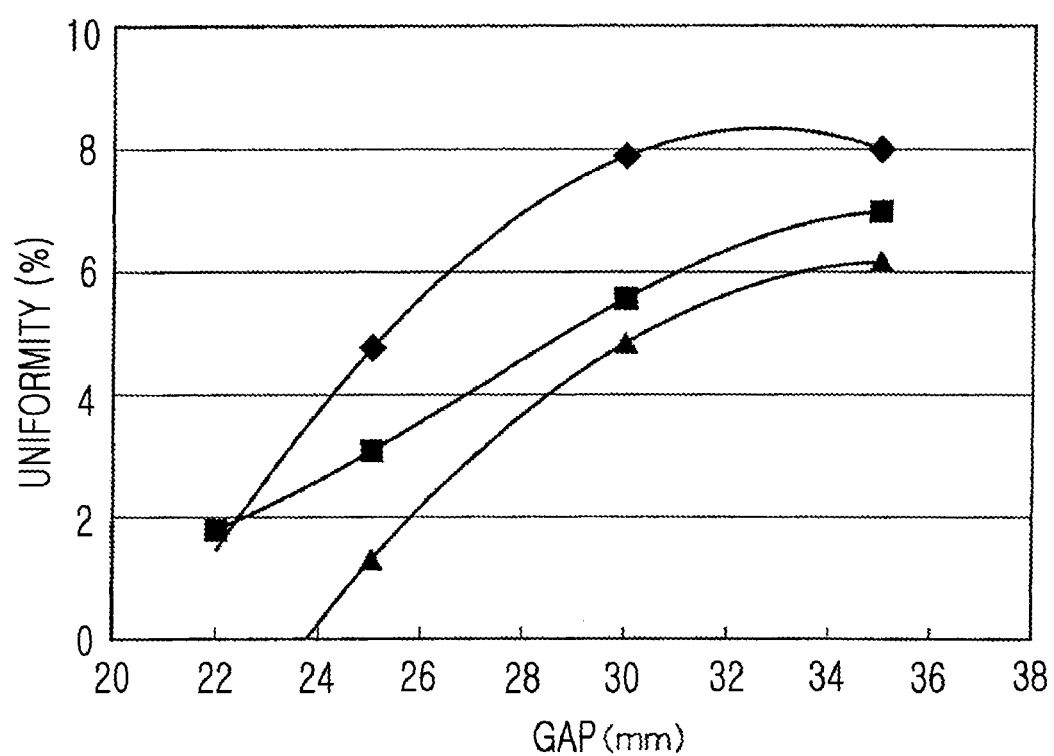
FIG. 5 is a graph showing results of measuring in-plane E/R uniformity of a wafer, regarding a plasma etching process performed by using the upper electrodes of Comparative Example 1, Embodiment 1, and Embodiment 2 of FIG. 4.

FIG. 5 is a graph showing results of measuring in-plane E/R uniformity of a wafer in a plasma etching process performed by using the upper electrodes according to Comparative Example 1, Embodiment 1, and Embodiment 2. In FIG. 5, "♦" shows Comparative Example 1, "■" shows Embodiment 1, and "▲" shows Embodiment 2.

As shown in FIG. 5, it can be known that the uniformities of Embodiment 1 and Embodiment 2 are better than the uniformity of Comparative Example 1. It was thought that this was because, by burying the dielectric 26 in the portion of the upper electrode facing the central portion of the processing space PS, the plasma density in the peripheral portion of the processing space PS is increased while decreasing the plasma density in the central portion of the processing space PS, thereby realizing the uniform density distribution of plasma in the processing space PS.

Also, in each of Comparative Example 1, Embodiment 1, and Embodiment 2, the uniformities were improved more as the gap G was narrower. This was thought to be because, as the gap G is narrower, a confinement effect of the plasma due to a sheath generated on the surface of the upper electrode is increased more, and thus, diffusion of plasma is suppressed, and as a result, the plasma density of the peripheral portion of the processing space PS is not decreased much.

Also, it can be known that the uniformity of Embodiment 2 is better than the uniformity of Embodiment 1. This was thought to be because, in Embodiment 2, since the portion of the aluminum material 41 facing the processing space PS further protrudes toward the processing space PS than the portion of the dielectric 26 facing the processing space PS, the sheath generated on the surface of the upper electrode further protrudes to the processing space PS in the peripheral portion of the upper electrode than in the central portion of the upper electrode, and thus the confinement effect of plasma due to the sheath is increased more.

In the present embodiment, the upper electrode 24 has a plate shape, and the dielectric 26 may be provided along a plane direction of the upper electrode 24 in a portion of the upper electrode 24. For example, the dielectric 26 may be buried only in the portion of the upper electrode 24 facing the central portion of the wafer W held on the susceptor.

Figure 6:
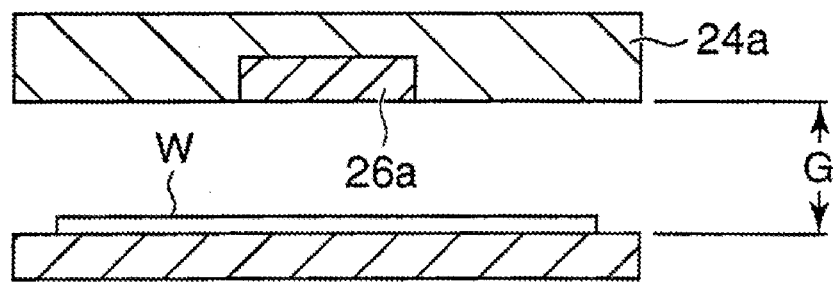
FIG. 6 is a view showing a first modified example of the substrate processing apparatus according to the present embodiment.

FIG. 6 is a view showing a first modified example of the substrate processing apparatus according to the present embodiment.

In FIG. 6, since a dielectric 26a is buried only in a portion of an upper electrode 24a facing the central portion of the wafer W held on the susceptor, and the potential difference between the plasma of the processing space PS and the ground 36 in the portion where the dielectric 26a is buried is divided into the potential difference between the plasma and the dielectric 26a and the potential difference between the dielectric 26a, which serves as the capacitor C, and the ground 36, the plasma density in the portion of the processing space PS facing the central portion of the wafer W may be decreased. Accordingly, a changing range of the plasma density in the portion facing the central portion of the wafer W may be increased when the gap G is changed, and thus a control range of E/R on the central portion of the wafer W may be increased more than a control range of E/R on the peripheral portion of the wafer W. As a result, the E/R in the central portion of the wafer W is actively controlled by changing the gap G, thereby, for example, increasing the in-plane E/R uniformity of the wafer W.

Figure 7:
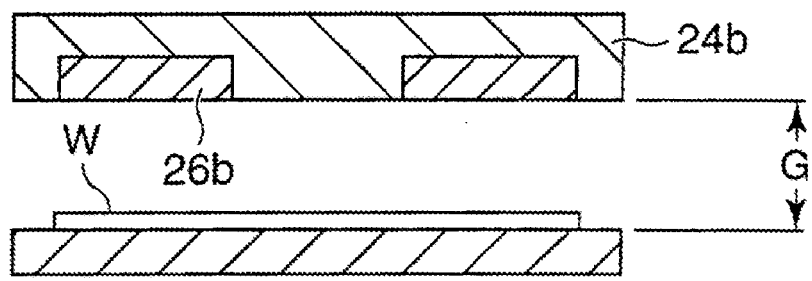
FIG. 7 is a view showing a second modified example of the substrate processing apparatus according to the present embodiment.

FIG. 7 is a view showing a second modified example of the substrate processing apparatus according to the present embodiment.

In FIG. 7, a dielectric 26b is buried in a portion of an upper electrode 24b facing the peripheral portion of the wafer W held on the susceptor excluding the central portion of the wafer W, and a portion of the upper electrode is engaged to the annular dielectric 26b in the central portion of the annular dielectric 26b. Here, in the portion where the dielectric 26b is buried in, the potential difference between the plasma of the processing space PS and the ground 36 is divided into the potential difference between the plasma and the dielectric 26b and the potential difference between the dielectric 26b, which serves as the capacitor C, and the ground 36, and thus the plasma density in the portion of the processing space PS facing the peripheral portion of the wafer W may be decreased. Accordingly, a changing range of the plasma density in the portion facing the peripheral portion of the wafer W may be increased when the gap G is changed, and thus the control range of E/R on the peripheral portion of the wafer W based on the changing gap G may be greater than the control range of E/R on the central portion of the wafer W. As a result, the E/R on the peripheral portion of the wafer W may be actively controlled by changing the gap G.

Figure 8:
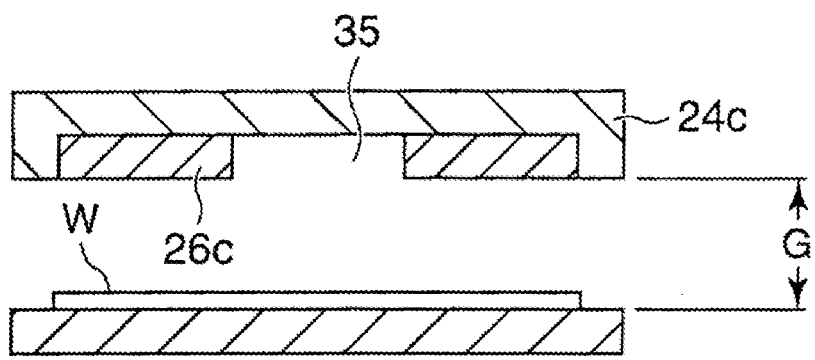
FIG. 8 is a view showing a third modified example of the substrate processing apparatus according to the present embodiment.

FIG. 8 is a view showing a third modified example of the substrate processing apparatus according to the present embodiment, and is a view schematically showing an upper electrode, an annular dielectric buried in the upper electrode, a susceptor, and the wafer W held on the susceptor.

In FIG. 8, a dielectric 26c is buried in a portion of the upper electrode 24c facing the peripheral portion of the wafer W held on the susceptor excluding the central portion of the wafer W, and a space portion 35 is formed in the central portion of the annular dielectric 26c. Here, like the second modified example described above, a control range of E/R on the peripheral portion of the wafer W based on the changing gap G may be greater than a control range of E/R on the central portion of the wafer W.

In the present embodiment, the dielectric 26 buried in the upper electrode 24 is formed of a material having a dielectric constant different from that of a material for forming the upper electrode 24, such as SiC or Si. In other words, a material for forming the dielectric 26 may be, for example, a metal oxide, such as quartz, yttria ($Y_2O_3$), alumina ($Al_2O_3$), silica ($SiO_2$), or the like, a metal nitride, such as aluminum nitride (AlN), or boron nitride (BN) or silicon carbide (SiC).

In the present embodiment, the same effect may be obtained when forming a space portion in the portion of the upper electrode 24 instead of burying the dielectric 26 in the portion. Here, the space portion serves as a dielectric.

In the present embodiment, since it is not easy to directly find an optimum process condition, a plasma etching process may be performed first under a condition in which an optimum process condition is likely to be obtained according to a processing purpose, and then, based on the condition and a process result, various process conditions close to the optimum process condition may be found.

The present embodiment has been described based on improving the in-plane E/R uniformity of the wafer W, but the present invention may be applied to increase or decrease E/R on a predetermined portion of the wafer W.

Also, in the present embodiment, the upper electrode 24 is moveable with respect to the susceptor 12, but the susceptor 12 may be moveable with respect to the upper electrode 24.

According to the present invention, since the potential difference between the plasma generated in the processing space and the ground is divided into the potential difference between the plasma and the dielectric, and the potential difference between the dielectric and the ground, by burying the dielectric at least in a portion of the upper electrode, the potential difference between the portion where the dielectric is buried and the plasma may be different from the potential difference between the portion where the dielectric is not buried and the plasma. Accordingly, the plasma density in the processing space may be controlled according to portions, thereby realizing uniform density distribution of the plasma in the processing space. As a result, a plasma process may be performed uniformly on the substrate. Also, since an interval between the upper electrode and the lower electrode is changed, plasma density between the upper electrode and the lower electrode is changed to generate a plurality of process conditions, and thus one-chamber plural processes may be realized. In other words, one-chamber plural processes may be realized while performing a plasma process uniformly on the substrate.

The present invention has been described with reference to the embodiments, but the present invention is not limited to the embodiments.

Also, in the embodiments described above, the substrate on which the plasma process is performed is not limited to the wafer for a semiconductor device, and may be any substrate used in a FPD (Flat Panel Display) including an LCD (Liquid Crystal Display) or the like, a photomask, a CD substrate, a print substrate, or the like.

Also, an objective of the present invention is achieved by supplying a recording medium storing a program code of software for realizing the functions of the above described embodiments, to a system or an apparatus, and by reading and executing the program code stored in the recording medium by using a computer (or CPU, MPU, or the like) of the system or the apparatus.

Here, the program code read from the recording medium realizes the functions of the above described embodiments, and thus the program code and the recording medium storing the program code form the present invention.

Also, examples of the recording medium for supplying the program code include a Floppy (registered trademark) disk, a hard disk, an magneto-optical disk, optical disks such as CD-ROM, CD-R, CD-RW, DVD-ROM, DVD-RAM, DVD-RW, DVD+RW, etc, a magnetic tape, a nonvolatile memory card, ROM, etc. Alternatively, the program code may be downloaded via a network.

Also, the functions of the above described embodiments are realized not only by executing the program code read by the computer, but also by an OS (operating system) or the like activated on the computer executing a part of or entire actual processes based on directions of the program code.

Also, the functions of the above described embodiments may be realized by writing the program code read from the recording medium on a memory included in a function extending board inserted into a computer or a function extending unit connected to a computer, and then a CPU or the like included in the extending board or extending unit executing a part of or entire actual processes of the extending function based on directions of the program code.

What is claimed is:

1. A substrate processing method for performing an etching process on a substrate by using plasma in a substrate processing apparatus, the substrate processing apparatus comprising an accommodating chamber which accommodates the substrate, a lower electrode which is disposed inside the accommodating chamber and on which the substrate is held, an upper electrode which faces the lower electrode, a high frequency power source which is connected to the lower electrode, a processing space between the upper electrode and the lower electrode, and a ground which is electrically connected to the upper electrode, one of the upper electrode and the lower electrode being moveable with respect to the other, and the substrate processing method comprising:

dividing a potential difference between plasma generated in the processing space and the ground into a potential difference between the plasma and a dielectric and a potential difference between the dielectric and the ground, by the dielectric buried in at least a portion of the upper electrode;

performing a first process on the substrate while an interval between the upper electrode and the lower electrode is maintained to a first distance;

changing an etching rate by changing the interval to a second distance after the first process; and performing a second process on the substrate by using the changed etching rate while maintain the interval to the second distance.

2. The substrate processing method of claim 1, wherein the upper electrode is an electrode having a plate shape, and the dielectric is provided along a plane direction of the upper electrode.

3. The substrate processing method of claim 2, wherein the dielectric is provided only in a portion, of the upper electrode, facing a central portion of the substrate held on the lower electrode.

4. The substrate processing method of claim 2, wherein the dielectric has a circular plate shape having a through hole in a central portion of the dielectric, and is buried in the upper electrode such that the through hole faces a central portion of the substrate held on the lower electrode.

5. The substrate processing method of claim 1, wherein the interval between the upper electrode and the lower electrode is decreased, thereby increasing the etching rate.

6. The substrate processing method of claim 1, wherein the dielectric is formed of any one of quartz, yttria ($Y_2O_3$), alumina ($Al_2O_3$), silica ($SiO_2$), aluminum nitride (AlN), boron nitride (BN), and silicon carbide (SiC).

7. The substrate processing method of claim 1, wherein a thickness of the dielectric is equal to or larger than 10 mm and equal to or smaller than 15 mm.

* * * * *